INVENTOR
Robert W. Haisty

BY John E. Vandigriff
ATTORNEY

INVENTOR
Robert W. Haisty

BY John E. Vandigriff
ATTORNEY

United States Patent Office 3,422,322
Patented Jan. 14, 1969

3,422,322

DRIFT TRANSISTOR

Robert W. Haisty, Richardson, Tex., assignor to Texas Instruments Incorporated, Dallas, Tex., a corporation of Delaware Filed Aug. 25, 1965, Ser. No. 482,441
U.S. Cl. 317—235 9 Claims
Int. Cl. H01l 11/00

ABSTRACT OF THE DISCLOSURE

A drift transistor wherein the concentration gradient across the base region decreases exponentially due to the combined gradients of shallow and deep impurities.

This invention relates to transistors and more particularly to an improved drift transistor.

The object of the drift transistor is mainly to obtain higher frequency operation by decreasing the base transit time. In a drift transistor the transition of the minority carriers across the base is caused by a built-in field. The carriers are said to "drift" across the base. This is in contrast with the ordinary transistor in which the minority carriers "diffuse" across the base. The diffusion principally is under the influence of external biasing. In semiconductors having very short minority carrier lifetimes, it is difficult to construct a transistor with a sufficiently thin base region to allow most of the injected minority carriers to reach the collector before recombining with the majority carriers. It is also desirable to increase the current gain for a given base width. The degree of purity which is available in the starting material also plays an important part in determining the current gain for a given base width. This fact is of importance, since it is desirable to make the change in the majority carrier concentration across the base as large as possible to get maximum built-in drift potential. However, the maximum concentration allowable at the emitter side is limited by the fact that the emitter efficiency falls off if the impurity concentration in the base region approaches that in the emitter region. The minimum effective concentration in the base is, of course, limited by the concentration in the collector region which is usually that of the starting material.

For a given potential drop $\Delta V$ in the base region, the smallest average transit time occurs for a uniform electrostatic field E in the region. Since a constant field is obtained by varying the majority carrier concentration exponentially, this type of variation should be approximated for best performance. If it is considered that there is a background doping impurity concentration which is several orders of magnitude greater than intrinsic carrier concentration $n_i$ in the higher band gap semiconductor (for example, in gallium arsenide $n_i$ at 300° K. is $3\times10^6$ cm.$^{-3}$ and impurity concentrations are at least $10^{14}$ cm.$^{-3}$) then it is clear that in calculating the true carrier concentration, compensation between the dopant added purposely and the background impurity must be considered. For example, for a material doped P with a shallow acceptor, the hole concentration $p$ does not depend only on $N_a$, the shallow acceptor concentration, but rather on $(N_a-N_d)$ where $N_d$ is the donor impurity concentration. The term "shallow acceptor" used above and "deep" acceptor which will be used hereafter refer to the activation energies of the particular dopant. For a dopant to be a deep acceptor, the activation energy is at least several times larger than $kT$, for example, about 4 $kT$ or greater where $k$ is Boltzman's constant and T is the absolute temperature ($kT$ being equivalent to 0.026 electron volt at room temperature).

It is therefore an object of the invention to provide a transistor wherein the hole concentration decreases exponentially with distance across the base.

It is still another object of the invention to provide a transistor which has a constant field distribution across the base.

Still another object of the invention is to provide a transistor wherein both deep and shallow dopants are diffused into the base to provide a hole distribution across the base which will yield a constant field.

Other objects, features and advantages of the invention will become more readily understood from the following detailed description and appended claims when considered in conjunction with the accompanying drawings, in which:

Figures 1, 3:
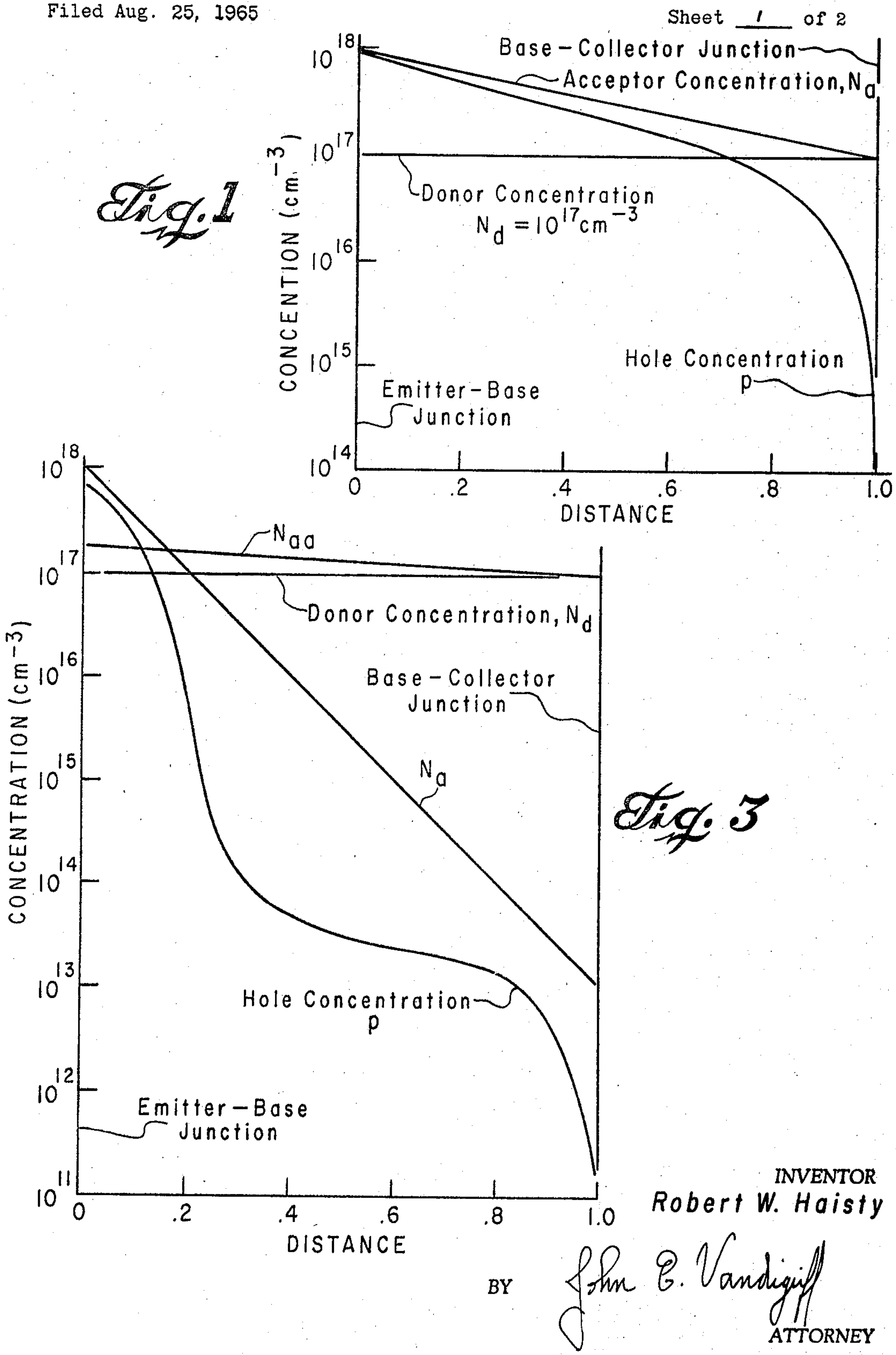
FIGURE 1 is a graph illustrating the hole concentration for an exponential distribution of a single acceptor impurity with a given background of donor impurity.
FIGURE 3 is a graph illustrating the hole concentration for a device wherein both shallow and deep acceptor impurities have been diffused therein to concentrate the built-in field near the emitter.

When the hole concentration in the base region of a transistor is properly calculated, it may be seen that an exponential distribution of shallow acceptor impurities does not produce an exponential distribution of holes across the base region, but rather the hole concentration drops much more rapidly near the collection junction since $N_a$ approaches $N_d$. Since the electric field is proportional to the rate of change of hole concentration with distance, this means that the field will not be constant over the base, but will be highest near the collector. An example of this is shown in FIGURE 1 in which a base region has an exponential distribution of acceptor impurity and a constant background of donor impurity. The graph in FIGURE 1 relates to an NPN device wherein the distance from 0 to 1.0 represents the base region of the device, 0 representing the emitter base junction, and 1.0 representing the base collector junction of the transistor. The horizontal line $10^{17}$ represents the donor concentration of the starting material of the transistor wafer in which the donor concentration is $10^{17}$ atoms per cubic centimeter. An acceptor impurity $N_a$ is diffused through the base region, the concentration being approximately $10^{18}$ at the emitter base junction and decreasing down to about $10^{17}$ at the base-collector junction. This acceptor impurity gives the base region an overall type characteristic commonly referred to as P-type, there being a large number of holes in the crystal structure. The greater the acceptor impurity concentration within a structure the greater the hole concentration. Therefore, at the emitter-base junction where the acceptor concentration is greater, the hole concentration will be the greatest. This decreases as the acceptor concentration decreases across the base until the base-collector junction is reached, at which time the hole concentration approaches 0. The collector being of N-type material and having an excess of electrons in the crystalline structure, there will be essentially no holes within the collector region. With the hole concentration as shown in FIGURE 1, the built-in field potential across the base will be largest near the collector since the field is proportional to the rate of change of the hole concentration. For a distribution of acceptor impurities following a complementary error function (ERFC) profile, as is obtained by diffusion with a constant surface concentration, the situation is even worse, since the ERFC distribution falls off with distance more rapidly than exponentially, thus causing the hole concentration to drop even more rapidly near the collector junction.

To obtain a distribution of a shallow acceptor (or donor) impurity which would provide an approximately exponential variation of holes (or electrons) across the base would be most difficult by any previously known method, since as $N_a \rightarrow N_d$, the hole concentration is given by a very small difference between large numbers. The maximum useful value of the built-in potential $\Delta V$ across the base (which is given by the difference in the separation of the Fermi level from the band edge of the two sides of the base region) is just less than half the band gap. If the base is heavily doped at the emitter junction so that the Fermi level is near the valence band edge (for an NPN transistor) then it is desirable to have the hole concentration decrease exponentially with distance across the base to a value which will correspond to the Femi level being located slightly below the middle of the forbidden gap. In gallium arsenide, for example, the band gap is about 1.4 ev. at 300° K. and a reasonable value of slightly less than one half the band gap is about 0.6 ev. The Fermi level is given in terms of the hole concentration by the equation:

$$p = N_v e \frac{-E_f}{kT}$$

where $E_f$=Fermi level
$k$=Boltzman constant
$N_v$=Density of states in the valence band $\approx 10^{19}$ cm.$^{-3}$ for GaAs
$p$=hole concentration.

To bring the Fermi level up to 0.6 ev. above the valence band edge requires, according to this equation, that the hole concentration be lowered to about $3.8 \times 10^8$ cm.$^{-3}$. The lowest background impurity concentration that can be reasonably assumed for the known semiconductor is about $10^{14}$ cm.$^{-3}$. In order to control the hole concentration at a $3.8 \times 10^8$ cm.$^{-3}$ level requires bringing the acceptor dopant to within almost 1 part per million of the residual donor concentration (which would also have to be constant to within about 1 part per million). Such close control is clearly impossible by present methods.

Figure 2:
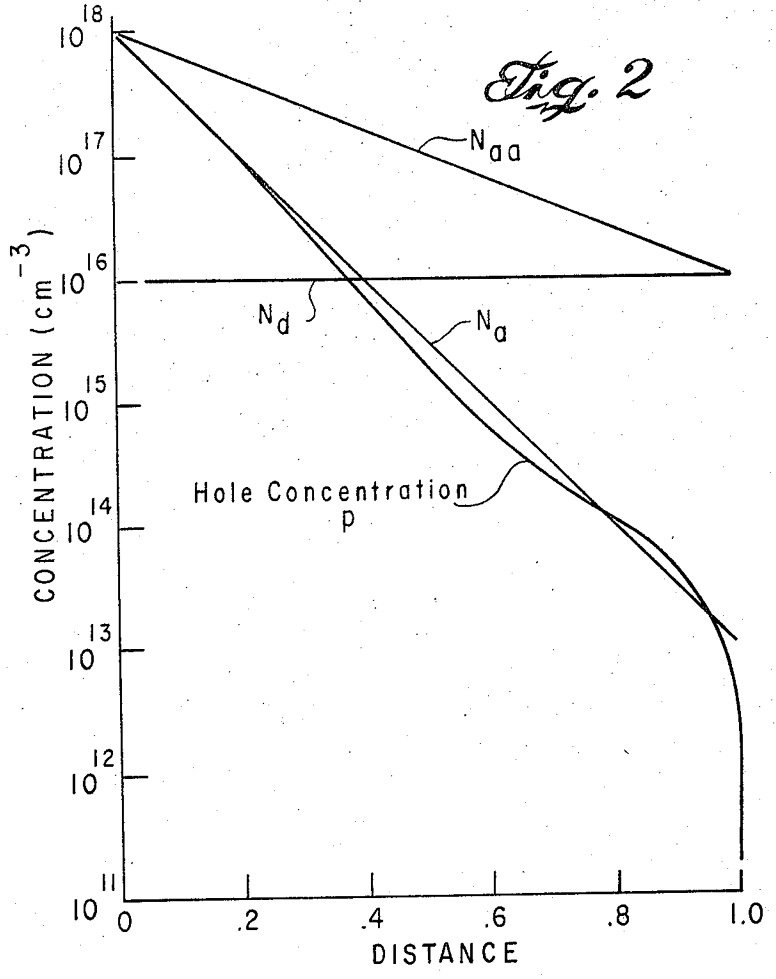
FIGURE 2 is a graph illustrating the hole concentration for a device in which both shallow and deep acceptor impurities have been diffused therein to obtain a hole distribution which is quite close to exponential.

FIGURE 2 is illustrative of a method by which an approximately exponential hole (electron) distribution across the base by doping with a deep acceptor (donor) impurity, may be achieved. As in FIGURE 1, $N_d$ is the donor concentration of the starting material. $N_a$ and $N_{aa}$ (FIGURE 2) are two acceptor impurities diffused in the base, $N_{aa}$ having high activation energy and $N_a$ having a low activation energy. The required low free hole concentration is obtained by virtue of the fact that most of the holes are "frozen out" on the deep acceptor impurity. In this case, rather than being determined by the difference between two large numbers, the hole concentration is given to a good approximation by the equation:

$$p = \left[\frac{Naa}{Nd} - 1\right] \cdot \left[\frac{Nv}{gaa}\right] e^{\frac{\mathrm{Eaa}}{-\mathrm{kt}}}$$

where

N$aa$=deep acceptor concentration
N$d$=net donor concentration
N$v$=density of states in the valence band
E$aa$=activation energy of deep acceptor
$gaa$=total degeneracy of the deep acceptor ground state.

(See for example, Compound Semiconductor, R. K. Willardson, H. L. Goering, editors, p. 160, Reinhart Pub. Co., 1962, New York.) In the case given by the above aproximation the hole concentration can be reduced to very small values without particularly close control of the deep acceptor concentration. To obtain the required high concentration of holes at the emitter-base junction, a high concentration of shallow acceptors can be used, with its concentration dropping much more rapidly than the deep acceptor, so that it is negligibly small before the collector region is reached. By doping with a suitable combination of a shallow and a deep acceptor level, a hole distribution quite close to exponential can be obtained.

In some cases it may be advantageous to provide a high field region in the base near the emitter-base junction, as illustrated in FIGURE 3. If the current gain of the device is limited by short lifetime of the minority carriers, it is important to use the built-in drift field to maximum advantage to accelerate them. The mobility and lifetime can be appreciably lower in the more heavily doped region of the base near the emitter; thus, if the current gain is limited by short minority carrier lifetime in the base region, it can be increased by concentrating the built-in field near the emitter. This is easily accomplished with the combination of a shallow and deep impurity level, either diffused in or added during vapor phase deposition, in the proper combination.

The method used in providing the hole concentrations as shown in FIGURES 2 and 3 may be accomplished by diffusing two acceptor dopants, either simultaneously or separately, one with the high surface concentration and a shallow diffusion and another with a deeper diffusion and a lower concentration. The shallow diffusion can be obtained by using an impurity with a small diffusion coefficient using low diffusion temperature or by having a short diffusion time. For a simultaneous diffusion, the deep acceptor must have a larger diffusion coefficient than the shallow acceptor. When sequential diffusions are used, a deep acceptor is used first for a greater time and/or a greater temperature. The shallow acceptor is then diffused to desired depth.

Another method for producing the hole concentration is to change the concentration of the acceptor dopant during vapor deposition of an epitaxial layer or by combination of one acceptor impurity being introduced during the vapor phase and the other by diffusion or alloying.

By either of the above methods, the improvement comes about by the proper distribution of the two acceptor impurities through the base region to provide the desired hole concentration. Suitable impurities for silicon, germanium and gallium arsenide are shown in Table I.

TABLE I

| Material | Type Diffusion | | | |
|---|---|---|---|---|
| | Deep Acceptor | Shallow Acceptor | Deep Donor | Shallow Donor |
| Silicon | Cobalt, Zinc | Aluminum, Gallium, Indium | Manganese, Sulphur | Phosphorus Arsenic |
| Germanium | Cobalt, Nickel, Iron | do | Gold | Do. |
| Gallium Arsenide | Nickel, Cobalt, Copper, Iron | Zinc, Cadmium, Mercury, Magnesium | Vanadium | Silver, Selenium, Tellurium, Tin, Germanium. |

The above methods are not to be confused with double diffused methods wherein both emitter and base regions are diffused into a semiconductor wafer. If a diffused emitter device is to be made then there would have to be three diffusions, two to form the base region and one to form the emitter. The method of forming the emitter is not critical nor limited to any specific method.

Figure 4:
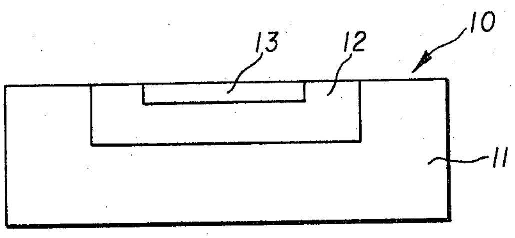
FIGURE 4 shows a typical transistor structure.

A typical example of a transistor structure is shown in FIGURE 4. Transistor 10 has a collector 11, base region 12 and an emitter 13. To form an NPN device, the base is diffused with, for example, one of the elements zinc or cobalt for a deep acceptor and one of the elements aluminum, gallium or indium for a shallow acceptor. These elements would be used in the case where silicon is the semiconductor material. Diffusion time and temperature for the various elements are well known.

After the base region 12 is formed by diffusing two of the elements, the emitter is formed by diffusing an N-type impurity material into the area 13. Any conventional contacts (not shown) may be attached to the device. The particular transistor shown is a planar transistor formed by a triple diffusion process, but as pointed out above, the device is not limited to one particular structure and may be either NPN or PNP.

Although the present invention has been shown and illustrated in terms of specific examples and methods, it will be apparent that changes and modifications are possible without departing from the spirit and scope of the invention as defined in the appended claims.

What is claimed is:

1. A transistor having an emitter, a base and a collector defining therebetween an emitter-base and a base-collector junction, means within the base effecting a concentration gradient in which the concentration of the majority carriers is relatively high at the emitter-base junction and decreases exponentially with distance toward the base-collector junction through said base, said means comprising a deep impurity dopant within said base having a first concentration at said emitter-base junction and decreasing exponentially through said base to a concentration at the base-collector junction equal to the concentration of an impurity effecting minority carrier concentration in said base, said deep impurity dopant having an activation energy greater than 4 $kT$ where $k$ is the Boltzmann constant in a given temperature unit and T is the absolute temperature in said given temperature unit; and a shallow impurity dopant within said base having a second concentration at said emitter-base junction and decreasing in concentration more rapidly than said deep impurity dopant decreases in concentration with distance through said base toward said base-collector junction, said shallow impurity dopant having an activation energy less than 4 $kT$.

2. The transistor of claim 1 wherein said base is of P-type conductivity, and said means effects a hole concentration which decreases exponentially with distance across said base from the emitter-base junction to the base-collector junction and comprises a deep acceptor impurity dopant and a shallow acceptor impurity dopant.

3. The transistor of claim 2 wherein said base comprises silicon, said deep acceptor impurity is either cobalt or zinc and said shallow acceptor impurity is either aluminum, gallium, or indium.

4. The transistor of claim 2 wherein said base comprises germanium, said deep acceptor impurity is either cobalt, nickel, or iron and said shallow acceptor impurity is either aluminum, gallium, or indium.

5. The transistor of claim 2 wherein said base comprises gallium arsenide, said deep acceptor impurity is either nickel, cobalt, copper, or iron and said shallow acceptor impurity is either zinc, cadmium, mercury, or magnesium.

6. The transistor of claim 1 wherein said base is of N-type conductivity, and said means effects an electron concentration which decreases exponentially with distance across the base from said emitter-base junction to said base-collector junction, and comprises a deep donor dopant and a shallow donor dopant.

7. The transistor of claim 6 wherein said base comprises silicon, said deep donor impurity is either manganese or sulfur, and said shallow donor impurity is either phosphorous or arsenic.

8. The transistor of claim 6 wherein said base comprises germanium, said deep donor impurity is gold and said shallow donor impurity is either phosphorus or arsenic.

9. The transistor of claim 6 wherein said base comprises gallium arsenide, said deep donor impurity is vanadium and said shallow donor impurity is either silver, selenium, tellurium, tin, or germanium.

References Cited

UNITED STATES PATENTS

| | | | |
|---|---|---|---|
| 2,964,689 | 12/1960 | Buschert et al. | 317—235 |
| 3,065,115 | 11/1962 | Allen | 317—235 |
| 3,084,078 | 4/1963 | Anderson | 317—235 |
| 3,176,151 | 3/1965 | Atalla et al. | 317—235 |
| 3,260,624 | 7/1966 | Wiener | 317—235 |

JOHN W. HUCKERT, *Primary Examiner.*

JERRY D. CRAIG, *Assistant Examiner.*

U.S. Cl. X.R.

148—190